United States Patent
Michoulier et al.

(10) Patent No.: US 11,962,288 B2
(45) Date of Patent: Apr. 16, 2024

(54) SURFACE ELASTIC WAVE FILTER WITH RESONANT CAVITIES

(71) Applicant: Soitec, Bernin (FR)

(72) Inventors: Eric Michoulier, Besançon (FR); Sylvain Ballandras, Besançon (FR); Thierry LaRoche, Besançon (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 18/248,183

(22) PCT Filed: Sep. 15, 2022

(86) PCT No.: PCT/FR2022/051736
§ 371 (c)(1),
(2) Date: Apr. 6, 2023

(87) PCT Pub. No.: WO2023/047042
PCT Pub. Date: Mar. 30, 2023

(65) Prior Publication Data
US 2023/0396236 A1    Dec. 7, 2023

(30) Foreign Application Priority Data
Sep. 27, 2021   (FR) ...................................... 2110135

(51) Int. Cl.
H03H 9/64        (2006.01)
H03H 9/02        (2006.01)
(52) U.S. Cl.
CPC ........ H03H 9/643 (2013.01); H03H 9/02653 (2013.01)

(58) Field of Classification Search
CPC ........................... H03H 9/643; H03H 9/02653
(Continued)

(56) References Cited

U.S. PATENT DOCUMENTS

| 4,290,033 A | 9/1981 | Kagiwada et al. |
| 9,325,293 B2 * | 4/2016 | Gorisse .................. H03H 9/564 |

FOREIGN PATENT DOCUMENTS

| DE | 2363701 A1 | 6/1975 |
| EP | 0608249 A1 | 8/1994 |

(Continued)

OTHER PUBLICATIONS

International Search Report for International Application No. PCT/FR2022/051736 dated Jan. 19, 2023, 2 pages.

(Continued)

*Primary Examiner* — Rakesh B Patel
*Assistant Examiner* — Jorge L Salazar, Jr.
(74) *Attorney, Agent, or Firm* — TraskBritt

(57) ABSTRACT

A surface elastic wave filter has resonant cavities and comprises a composite substrate formed of a base substrate and a piezoelectric upper layer; at least one input electroacoustic transducer and an output electroacoustic transducer, arranged on the upper layer, and at least one internal reflecting structure, arranged between the input electroacoustic transducer and the output electroacoustic transducer. The internal reflecting structure comprises a first structure comprising at least one reflection grating having a first period and a second structure comprising at least one reflection grating having a second period, the first period being greater than the second period.

14 Claims, 4 Drawing Sheets

(58) Field of Classification Search
USPC .......................................... 333/133, 193–196
See application file for complete search history.

(56) References Cited

FOREIGN PATENT DOCUMENTS

| | | |
|---|---|---|
| EP | 3599720 A1 | 1/2020 |
| JP | 2006-303834 A | 11/2006 |
| JP | 2009-273120 A | 11/2009 |
| WO | 2020/021029 A2 | 1/2020 |
| WO | 2021/044031 A1 | 3/2021 |

OTHER PUBLICATIONS

International Written Opinion for International Application No. PCT/FR2022/051736 dated Jan. 19, 2023, 3 pages.
Xu, Yufeng, Surface Acoustic Wave Longitudinally Coupled Resonators and Waveguide Coupled Resonators, McMaster University, Jul. 1994, 40 pages.
Rosenberg et al., Scattering Analysis and Design of SAW Resonator Filters, IEEE Transactions on Sonics and Ultrasonics, Vo.. Su+26, No. 3, May 1979, pp. 205-230.
Japanese Official Notice of Rejection for Application No. 2023-522962 dated Dec. 26, 2023, 12 pages with translation.

\* cited by examiner

SURFACE ELASTIC WAVE FILTER WITH RESONANT CAVITIES

CROSS-REFERENCE TO RELATED APPLICATIONS

This application is a national phase entry under 35 U.S.C. § 371 of International Patent Application PCT/FR2022/051736, filed Sep. 15, 2022, designating the United States of America, which claims the benefit under Article 8 of the Patent Cooperation Treaty to French Patent Application Serial No. FR2110135, filed Sep. 27, 2021.

TECHNICAL FIELD

The present disclosure relates to a surface acoustic wave filter with resonant cavities. Such a filter finds its application in the field of the processing of high-frequency signals, for example, in telecommunications applications.

BACKGROUND

With reference to FIG. 1, and as is known, for example, from EP0608249, such a filter 1 typically comprises, arranged on a piezoelectric substrate, at least two, respectively input and output, electroacoustic transducers 2a, 2b. The two transducers define a path along which surface elastic waves propagate. They also form the electrical input ports Pe and output ports Ps of the filter 1.

The filter 1 can comprise two external reflection gratings 3a, 3b (and preferably only reflecting), typically Bragg mirrors, arranged on either side of the pair of input 2a and output 2b transducers, along the axis X of propagation of the elastic waves.

The filter 1 comprises at least one internal reflection grating 4, arranged between the two transducers 2a, 2b, on the path X of the elastic waves and which can be equidistant from these two transducers 2a, 2b. This at least one internal reflection grating 4 has a non-zero transmission coefficient. A plurality of resonant cavities C1, C2 are defined in this way along the wave propagation path, these resonant cavities forming an equal number of poles of the filter 1.

Document DE2363701 also discloses several configurations of a surface elastic wave filter with resonant cavities.

Document WO2020021029 proposes numerous advantageous configurations of such a surface elastic wave filter with resonant cavities, these configurations all being made on a composite substrate, that is to say a substrate formed from a base substrate (constituting a mechanical support) and a piezoelectric upper layer. The elastic waves propagate in the upper layer in the form of longitudinal and/or shearing waves. The thickness of the upper layer is chosen to be on the order of magnitude of the central wavelength of the filter, or less than this wavelength. The propagation then occurs without losses of radiation in the base substrate.

The very general structure of the filter proposed by the aforementioned document makes it possible to synthesize a wide variety of band-pass filters having a low loss of insertion (<2 dB) in the passband and a significant rejection rate (>15 dB) outside this band.

It is well known (see, for example, EP0608249) that the synthesis of a surface elastic wave filter with resonant cavities can cause the appearance of secondary lobes in the filter rejection or transition band. These lobes are of amplitudes even higher when it is sought to widen the relative passband of the filter.

It would therefore be desirable to have a filter structure that can limit the amplitude of the lobes present in the rejection or transition band.

BRIEF SUMMARY

One aim of the present disclosure is to propose a filter structure making it possible to address this desire. More specifically, an object of the present disclosure is to propose a filter structure that reduces the amplitude a height of the lobes present in the rejection or transition band relative to the filter structures of the state of the art.

With a view to achieving this aim, the object of the present disclosure is to propose a surface elastic wave filter with resonant cavities comprising:
  a composite substrate formed of a base substrate and a piezoelectric upper layer;
  at least one input electroacoustic transducer and an output electroacoustic transducer, arranged on the upper layer;
  at least one internal reflective structure, arranged between the input electroacoustic transducer and the output electroacoustic transducer.

The internal reflective structure of the filter comprises:
  a first structure comprising at least one reflection grating having a first period;
  a second structure comprising at least one reflection grating having a second period, the first period being greater than the second period;

According to the present disclosure, the first structure comprises a first plurality of reflection gratings separated from one another by a first distance, the second structure comprises a second plurality of reflection gratings separated from one another by a second distance, and the first distance is less than the second distance.

According to other advantageous non-limiting features of the present disclosure, taken alone or according to any technically feasible combination:
  the first structure is distant from the input electroacoustic transducer by a first separation distance, the second structure is distant from the output transducer by a second separation distance, the first separation distance being less than the second separation distance;
  the filter further comprises two external mirrors arranged on either side of the input and output transducers;
  the reflection gratings and/or the external mirrors are made by arrays of metal fingers disposed on/in the top layer of the composite substrate;
  the reflection gratings and/or the external mirrors are made by arrays of grooves etched into the composite substrate;
  the composite substrate comprises at least one layer arranged between the base substrate and the piezoelectric upper layer;
  the base substrate has an electrical resistivity of greater than 1000 ohm·cm;
  the thickness of the piezoelectric upper layer is less than 20 microns;
  the input electroacoustic transducer and the output electroacoustic transducer are respectively comprised of two interdigitated comb electrodes;
  the distance separating the first structure and the second structure is equal to the arithmetic mean, within 10%, of the first distance and the second distance.

BRIEF DESCRIPTION OF THE DRAWINGS

Other features and advantages of the present disclosure will emerge from the following detailed description of the present disclosure with reference to the accompanying figures, in which.

DETAILED DESCRIPTION

Figure 1:
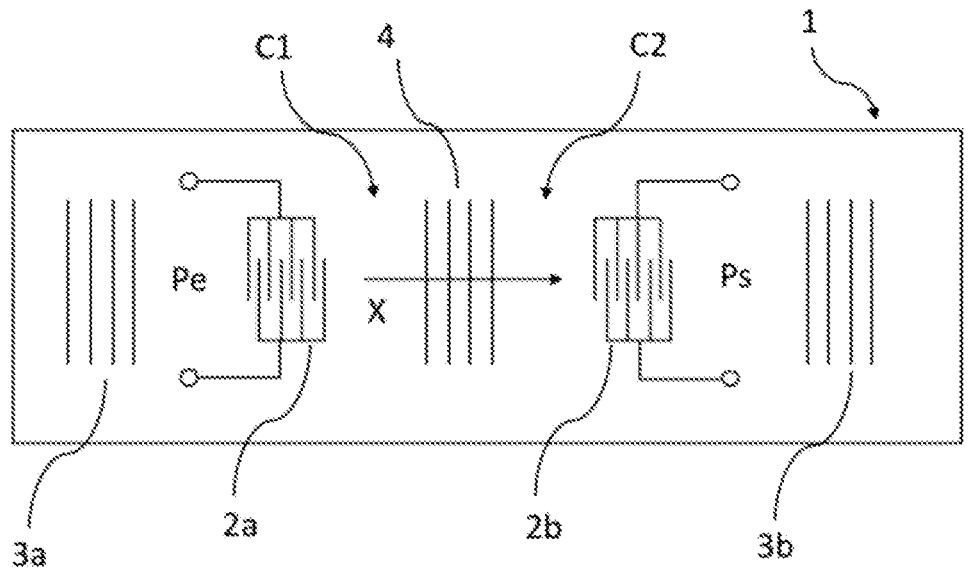
FIG. 1 shows a surface elastic wave filter with resonant cavities of the prior art.

For the sake of simplifying the following description, the same references are used for elements that are identical or perform the same function in different disclosed embodiments of the present disclosure and in the prior art.

The filter that will be described in the rest of this description is carried out on a composite substrate formed of a base substrate and of an upper piezoelectric layer, which rests on this base substrate. Other layers may be provided between these two elements. It may, for example, be one or a plurality of amorphous layer(s) facilitating their assembly. This amorphous layer (or the plurality of amorphous layers) may be, or comprise, silicon oxide. The thickness of the amorphous layer may be greater than or less than 200 nm in thickness, in particular, it may be chosen between 10 nm and 6 microns. A Bragg mirror formed of a stack of layers with an elastic impedance periodically alternating is possible between the upper layer and the silicon substrate.

The piezoelectric upper layer of the composite substrate may consist of aluminum nitride (AlN), zinc oxide (ZnO), PZT, potassium niobate ($KNbO_3$) and similar materials such as KTN, PMN-PT and related materials, gallium nitride (GaN), lithium tantalate ($LiTaO_3$) or lithium niobate ($LiNbO_3$). Preferably, the crystallographic orientation of lithium tantalate ($LiTaO_3$) or lithium niobate ($LiNbO_3$) is defined as (YXl)/θ according to the IEEE 1949 Std-176 standard, θ being a crystallographic orientation angle comprised between 0° and 60° or between 90° and 150°, Y and X being the crystalline axes, and l representing the length of a plate collinear to X around which the rotation θ is carried out.

The base substrate of the composite substrate may be a high electric resistivity substrate, in particular, a silicon substrate. High resistivity means an electrical resistivity of more than 1000 ohm·cm. Provision may be made for the base substrate to comprise an upper layer for trapping electrical charges, for example, a layer of polycrystalline silicon. The composite substrate may also be made of diamond carbon, sapphire, glass or silicon carbide.

The composite substrate may be formed in multiple ways, and, in particular, via Smart Cut™ technology. According to this technology, a thin layer to be transferred is defined in a piezoelectric donor substrate by ion implantation of light-weight species (hydrogen and/or helium, for example) through a main face of this donor substrate. This implantation forms a fragile zone defining the thin layer with the main face of the substrate. The donor substrate is assembled, by its main face, to the base substrate, and the donor substrate is fractured at the fragile zone in order to transfer the thin layer, for example, using a heat and/or mechanical treatment.

Alternatively to this approach, and, in particular, when the piezoelectric upper layer of the composite substrate is relatively thick, on the order of 5 microns to 20 microns or more, the composite substrate can be formed by assembling a donor substrate to the base substrate and thinning the donor substrate, for example, by CMP, grinding, or polishing.

In all cases, and regardless of the approach chosen, the transfer of the thin layer leads to forming a composite substrate formed of a monocrystalline piezoelectric upper layer on the base substrate.

The thickness of the piezoelectric upper layer is on the order of magnitude of the length of the elastic wave, which is intended to propagate therein. Preferably, the thickness of the piezoelectric upper layer is less than this wavelength, for example, about 20 microns or less. The thickness of the base substrate is itself much greater than the thickness of the piezoelectric upper layer, and typically at least ten times or one hundred times greater than this layer, for example, between 250 microns and 500 microns.

Figure 2A:
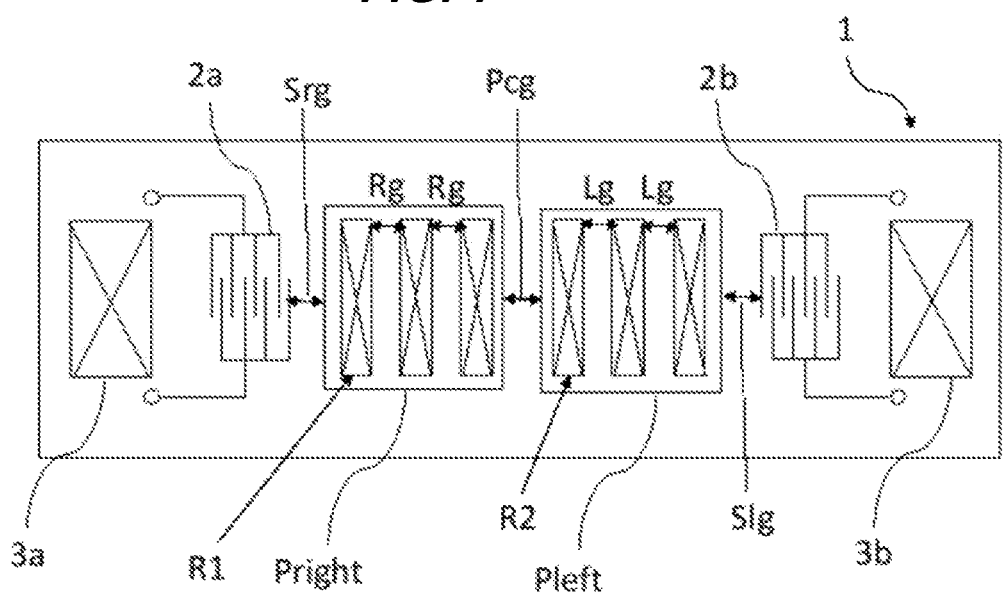
FIGS. 2A and 2B show, in schematic top and sectional view, a surface elastic wave filter with resonant cavities according to the present disclosure.
Figure 2B:
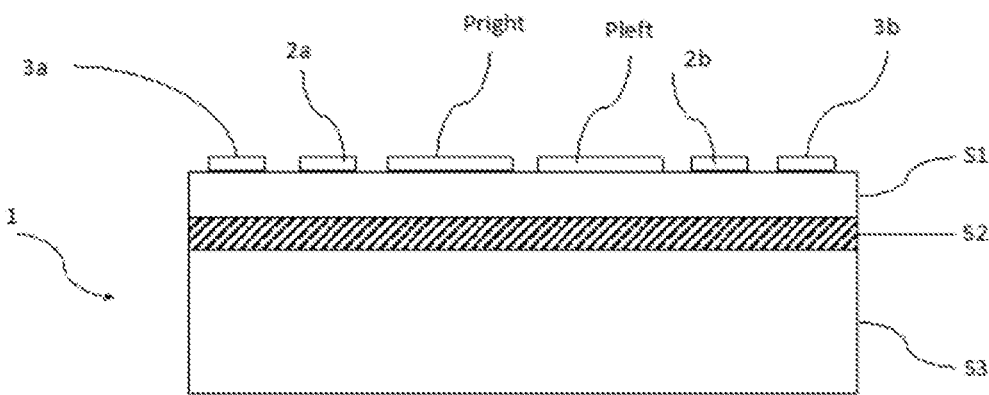

FIGS. 2A and 2B show a surface elastic wave filter 1 with resonant cavity, which is the subject of the present disclosure. This filter 1 is produced on or in the upper piezoelectric layer S1 of the composite substrate S, in a conventional manner, here assembled to a support S3 via an assembly layer S2. Reference may be made to the work "Surface acoustic wave filters with application to electronic communications and signal processing" from David P. Morgan Academic Press; $2^{nd}$ edition (Aug. 9, 2007) to obtain the general principles allowing the synthesis of such a surface elastic wave filter.

The filter is a bandpass filter, which has a central frequency $f_0$ and passband Δf, which can be expressed as a fraction of this central frequency, typically between 0.1% and 10%.

The filter 1 comprises at least one input electroacoustic transducer 2a and an output electroacoustic transducer 2b. The electromagnetic signal to be filtered is applied to the input electroacoustic transducer 2a and the filtered electromagnetic signal is taken from the output electroacoustic transducer 2b. These two transducers therefore respectively form an input port and an output port of the filter. However, it should be noted that the "input" and "output" designation is totally arbitrary and that the filter can be exploited by applying/presampling an electromagnetic signal on either of the two ports.

Very generally, the transducers 2a, 2b are in accordance with those known in the prior art, a few features of which are listed below.

Here each transducer 2a, 2b consists of two interdigitated comb electrodes. As is well known, per se, such transducers 2a, 2b consist of an array of metal fingers, which are alternately connected to two buses between which a difference in electrical potential is applied/removed. With this device it is possible to directly generate/detect a surface elastic wave in the piezoelectric upper layer. The input 2a and output 2b transducers are generally configured to be identical, but it is not out of the question for them to differ, in particular, in order to optimize the response of the filter.

The metal of the electrodes is typically based on aluminum, for example, pure aluminum or an aluminum alloy such as aluminum doped with Cu, Si or Ti. It is nevertheless possible to use another material, for example, to establish a higher reflection coefficient for a lower relative electrode thickness. In this regard, the preferred electrode materials are copper (Cu), molybdenum (Mo), nickel (Ni), platinum (Pt) or gold (Au) with an adhesion layer such as titanium (Ti) or tantalum (Ta) or chromium (Cr), zirconium (Zr), palladium (Pd), iridium (Ir), tungsten (W), etc.

The period p of the electrodes is generally chosen such that $p=\lambda/2$, $\lambda$ being the wavelength of the elastic wave, which propagates in the piezoelectric upper layer at the resonance frequency $f_r$ of the transducer. Other configurations are possible, and more generally the period p can be written as $p=\lambda/(nb\_elec)$, with nb_elec being the number of fingers (electrodes) per wavelength. These parameters are linked by the relationship $\lambda=V/f_r$, wherein V represents the phase velocity of the elastic wave under the transducer. The speed of the elastic wave on the free surface or under an electroacoustic transducer depends, in particular, on the nature of the material in which the wave propagates, and it is generally known or accessible to the person skilled in the art.

In the case of the band-pass filter, which is the subject of this description, the resonance frequency $f_r$ is set in the passband of the filter or, preferably, at a lower frequency than the lower bound of this band. By setting this resonant frequency, the wavelength $\lambda$ of the wave can be determined, and therefore so can the period p of the transducer.

The metallization width of the electrodes, denoted a, is generally chosen so that the a/p ratio is of the order of 0.5. The number of pairs of fingers of each transducer is usually chosen in the order of 20 or 100. Generally, increasing the number of pairs of fingers makes it possible to increase the rejection of the frequencies not in the passband.

Returning to the general description of the filter shown in FIGS. 2A-2B, it is possible to provide two external mirrors 3*a*, 3*b* arranged on either side of the pair of the input 2*a* and output 2*b* transducers. As is well known, these mirrors 3*a*, 3*b* make it possible to confine as much of the elastic energy as possible between the two input and output electroacoustic transducers 2*a* and 2*b*. As such, they are designed to have a very high reflection coefficient, as close as possible to 1 (total reflection of the incident energy), by choosing the metal thickness of the fingers of the mirrors and the number of these fingers, typically a few tens per mirror in the case of a composite substrate for a shear wave. It should however be noted that these two external mirrors are in no way essential to the present disclosure, and that a filter according to the present disclosure and entirely functional can be devoid of them.

To finish the description of the filter shown in FIG. 2A-2B, the filter also comprises, arranged between the input electroacoustic transducer 2*a* and the output electroacoustic transducer 2*b*, at least one internal reflecting structure. The reflecting structure consists of a plurality of reflection gratings R1, R2 distributed along the path of propagation of the elastic waves. As has been recalled in the introduction of the present disclosure, this structure defines a plurality of resonant cavities along the propagation path of the elastic waves, these resonant cavities forming an equal number of poles of the filter 1.

Each reflection grating R1, R2 of the internal reflecting structure is formed of Bragg reflectors composed of metal fingers, preferentially short-circuited. The period of the array of fingers that constitute each reflection grating R1, R2 is generally chosen to be close (within 15%) to the period of the electrodes of the transducers, and therefore generally close to $\lambda/2$. By choosing the period of the reflection gratings R1, R2 that are less than that of the transducers, the signals whose frequency is greater than that of the passband of the filter will be better rejected, that is to say the presence of secondary lobes will be pushed back into higher frequencies. Conversely, by choosing the period of the reflection gratings R1, R2 that is greater than that of the transducers, the signals whose frequency is lower than that of the passband of the filter will be better rejected, that is to say the presence of secondary lobes will be pushed back into lower frequencies.

The number of metal fingers of each reflection grating R1, R2 determines the reflection coefficient of the grating, whose maximum value is equal to 1 (total reflection of the incident wave). A high-reflection coefficient, greater than 0.5 or greater than 0.8, makes it possible to increase the frequency rejection outside the passband. However, it reduces the passband, which may be compensated, if this reduction is excessive, by adding a reflection grating to the internal reflecting structure (and therefore a pole in the filter). Typically, this number of fingers of each reflecting structure may be between 10 and 40.

In the filter 1, which is the subject of the present disclosure, the internal reflecting structure comprises:
  a first structure Pright comprising at least one reflection grating R1 having a first period;
  a second structure Pleft comprising at least one reflection grating R2 having a second period, the second period being distinct from the first period.

By convention, it will be necessary that the first period, therefore corresponding to the period of the reflection grating R1 of the first structure Pright, is greater than the second period, therefore corresponding to the period of the reflection grating R2 of the second structure Pleft. "Greater" means that the first period is greater than the second period by at least 5 nm.

Advantageously, in order to provide more flexibility in the design of the filter, the first structure Pright has a plurality of reflection gratings R1, and each reflection grating may have the same first period. Similarly, the second structure Pleft also comprises a plurality of reflection gratings R2 and each reflection grating may have the same second period. In all cases, the periods of the reflection gratings of the first structure Pright are greater than the periods of the reflection gratings of the second structure Pleft.

When the first structure Pright has a plurality of reflection gratings R1, these gratings are separated from one another by a first distance Rg. Similarly, when the second structure Pleft has a plurality of reflection gratings R2, these gratings are separated from one another by a second distance Lg. In this configuration, the first distance Rg is less than the second distance Lg.

Preferentially, the first distance Rg is chosen to be less than a threshold distance Dg, called "Bragg distance" in the present description. At the same time, the second distance Lg is chosen to be greater than the Bragg distance Dg. The first distance Rg and the second distance Lg separating the reflection gratings R1, R2 in, respectively, the first structure Pright and the second structure Pleft, define the dimensions of the acoustic cavities.

In the case where the period of the reflection gratings is chosen close to $\lambda/2$, the Bragg distance is substantially equal to $\lambda/4$. More precisely, the Bragg distance Dg is defined by the relationship $Dg=(V'*p_0)/(2*V)$ wherein V represents the phase velocity of the elastic wave under the reflection gratings, V' the phase velocity of the free surface elastic wave and $p_0$ the period of a reflection grating whose maximum reflection would be equal to the central frequency f0 of the filter.

The first distance Rg can be chosen less than the Bragg distance Dg by a factor Fr of between 0.5 and 1, that is to say Rg=Fr*Dg. Similarly, the second distance Lg can be chosen greater than the Bragg distance Dg by a factor Fl of between 1 and 2, that is to say Lg=Dg*Fl.

The distance Pcg separating the first and the second structure may be chosen equal to the arithmetic mean of the first and the second distance Rg, Lg. "Equal" means equal to within 10%.

Also preferentially, the first structure Pright is distant from the input electroacoustic transducer 2a by a first separation distance Srg, the second structure Pleft is distant from the output transducer 2b by a second separation distance Slg, and the first separation distance Srg is less than the second separation distance Slg.

The number of reflection gratings R1, R2 in the first and the second structure Pleft, Pright may be chosen with great freedom. It defines the number of elastic cavities (in addition to those defined above by the first and the second separation distance Srg, Slg) and therefore the number of poles of the filter. A relatively large number of reflection gratings R1, R2 therefore makes it possible to conform the behavior of the filter to a predetermined template with great flexibility. It is not necessary to have the same number of reflection gratings R1, R2 in the two structures Pleft, Pright. It is typically possible to choose, according to the filtering constraints provided by the determined template, between 2 and 10 reflection gratings R1, R2 in each of the structures Pleft, Pright. The factors limiting the number of reflective structures R1, R2 will be ohmic losses and acoustic propagation.

By proposing a filter structure that has the features described above, it has been observed that it was then possible to propose a band-pass filter whose secondary lobes in the rejection or transition band were particularly reduced (for example, a reduction of at least 5 dB and typically of the order of 10 dB) even for a relatively high passband, of more than 1% relative width.

This very advantageous behavior of such a filter is made apparent by comparing, in the sections that follow in the description, the transfer function of a conventional filter (counter-example) to the transfer function of a filter synthesized using a structure according to the present disclosure (example).

In all the examples and counterexamples that follow, the composite substrate S comprises a layer S2 of silicon oxide that is 500 nm thick arranged between a piezoelectric layer S1 of LiTaO3 (YX1)/42° that is 0.6 microns thick and a base substrate S3 of silicon (100).

In such a composite substrate S, an elastic wave having the wavelengths targeted in these examples mainly propagates in the form of shear waves.

Counter-Example 1: Filter Having a Central Frequency of 400 MHz and 0.4% Relative Passband At the central frequency of the filter, and in the previously defined composite substrate, the wavelength of the elastic wave propagating in the upper layer S1 is 10.9 microns.

Figure 3A:
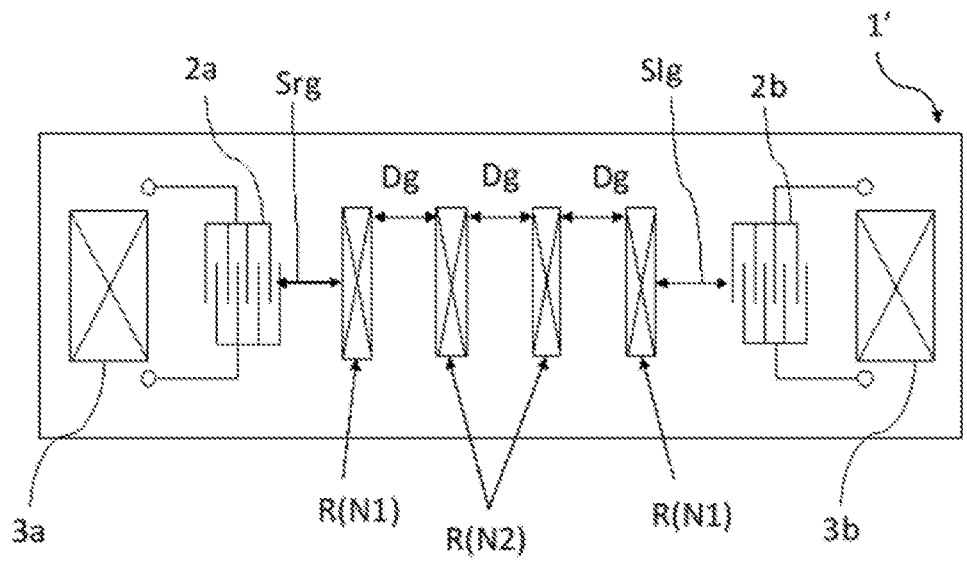
FIG. 3A shows a filter whose structure is compliant with the prior art.

FIG. 3A shows a filter 1' whose structure is compliant with the prior art. It has, formed on the composite substrate S, an input electroacoustic transducer 2a and an output electroacoustic transducer 2b and an internal reflecting structure composed here of four reflection gratings R separated from each other by an equal distance of the Bragg distance Dg. The filter 1' further comprises two external mirrors 3a, 3b arranged on either side of the input and output transducers 2a, 2b.

Figure 3B:
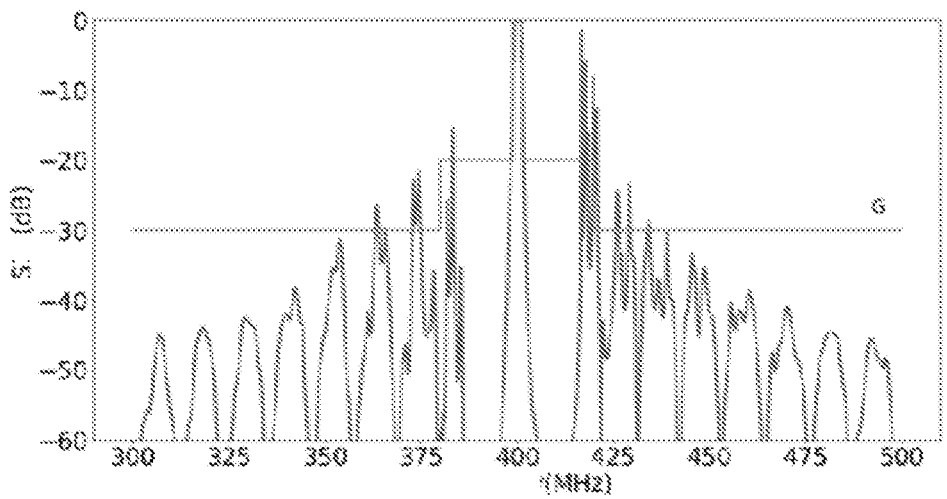
FIG. 3B shows the module of the transfer function of a filter according to a first counterexample.

The parameters of the filter 1' taken in counter-example 1 were obtained at the end of a series of simulations of a model of this filter aimed at shaping its transfer function to a predetermined band-pass template G, shown in FIG. 3B.

Thus, the period p of the input and output electroacoustic transducers 2a, 2b has been chosen at 5.450 microns. The metallization width of the electrodes is chosen so that the a/p ratio is set to 0.6. The number of pairs of metal fingers of the input electroacoustic transducer 2a and an output electroacoustic transducer 2b is set at 35.

The period of each external mirror is set at 5.557 microns. Each external mirror has 40 fingers and an a/p ratio of 0.5. The distance separating, respectively, the external mirrors of the input electroacoustic transducer and the output electroacoustic transducer is set to 2.110 microns.

The reflection gratings R are separated from one another by a distance Dg of 2.938 microns, close to a Bragg distance of a quarter of a wavelength. The first and the last of these reflection gratings are spaced apart, respectively, from the input electroacoustic transducer and from the output electroacoustic transducer by a distance of 3.36 microns. The reflection gratings R each have 30 metal fingers.

The periods of these reflection gratings 4 are all identical and equal to 5.557 microns.

FIG. 3B shows the module of the transfer function of this filter 1', as was obtained at the end of the simulations having led to its synthesis. It is observed that this transfer function conforms well to the template in the passband, but the presence of a plurality of lobes of particularly high amplitudes in the rejection band is also observed. The presence of these lobes is not desirable, as has been reported by the prior art document cited in the introduction of the present disclosure.

Figure 3C:
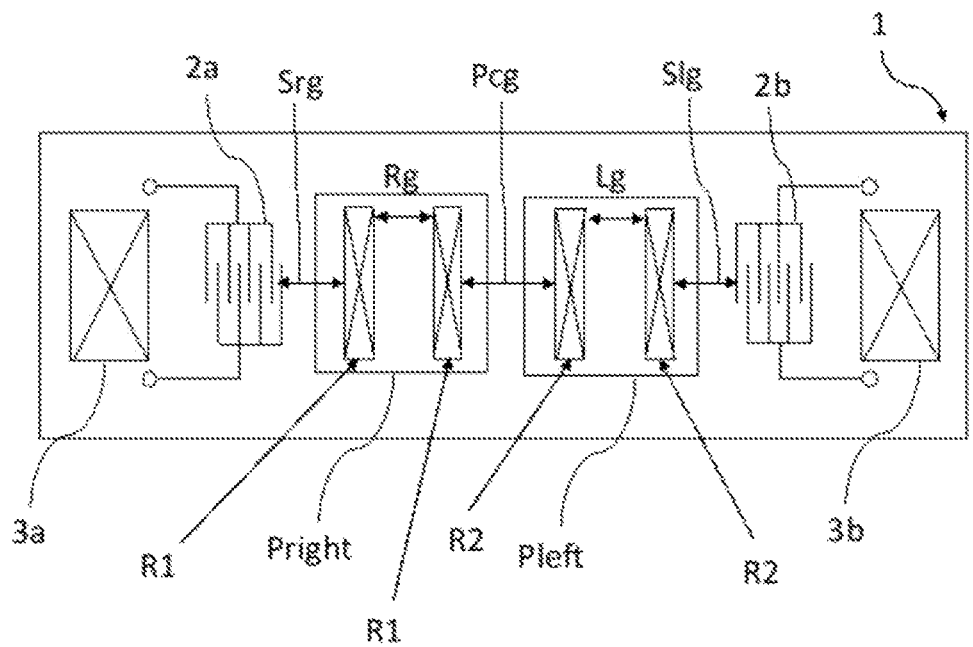
FIG. 3C shows the structure of a filter according to the present disclosure.
Figure 3D:
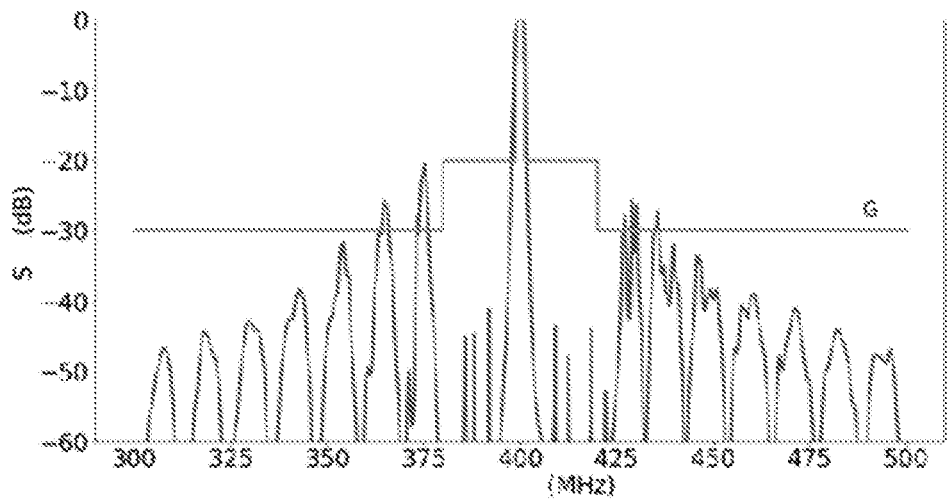
FIG. 3D shows the module of the transfer function of a filter of a first example embodiment of the present disclosure.

Example 1: Filter Having a Central Frequency of 400 MHz and 0.4% Relative Passband FIG. 3D shows the module of the transfer function of a filter 1 having the structure shown in FIG. 3C conforming to the structure of a filter of the present disclosure.

The parameters of the filter 1 of example 1 were obtained by simulation, just like those of counter-example 1. Like the filter 1' of counter-example 1, the filter 1 also has four reflection gratings R1, R2, two being arranged in the first structure Pright and the other two being arranged in the second structure Pleft. The reflection gratings R1, R2 each have 30 metal fingers. The other parameters obtained by simulation of this filter 1 are as follows:
First Structure Pright:
  Srg: 2.645 microns
  Rg: 1.446 micron, which is much lower than the Bragg distance Dg of 2.938 microns
  Period of the 2 reflection gratings R1 (the first period): 5.686 microns
Second Structure Pleft:
  Slg: 4.350 micron
  Lg: 4.790 microns, which is much higher than the Bragg distance Dg of 2.938 microns.
  Period of 2 reflection gratings R2 (the second period): 5.399 microns.

It can be seen that the first period of the reflection gratings R1 of the first structure Pright is much greater than the second period of the reflection gratings R2 of the second structure Pleft.

The distance Pcg separating the first structure Pright from the second structure Pleft is 3.125 microns, substantially equal to the arithmetic mean of the first distance Rg and the second distance Lg (3.118 microns).

The input and output electroacoustic transducers 2a, 2b have the same parameters as those of counter-example 1. The period of each external mirror is fixed at 5.557 microns. Each external mirror has 40 fingers and an a/p ratio of 0.5. The distance separating, respectively, the external mirrors of the input electroacoustic transducer and the output electroacoustic transducer is set to 1.800 microns.

FIG. 3D shows the module of the transfer function of this filter 1, as was obtained by simulation. It can be seen that the transfer function conforms well to the template in the passband. In addition, and although lobes are still present in the rejection band, they are of smaller and rejected amplitudes at frequencies farther from the passband.

The performance of the filter 1 of this example 1 is therefore much greater than the performance of the filter 1' of counter-example 1, the structure of which conforms to a filter structure of the prior art.

Counter-Example 2: A Filter Having a Center Frequency of 1900 MHz and 3.5% Relative Passband It is now sought to synthesize a filter whose relative passband is clearly wider than that of example 1 and counter-example 1.

At the central frequency of the filter, and in the composite substrate S previously defined, the wavelength of the elastic wave propagating in the upper layer S1 is 2.058 microns.

The structure of the filter of counterexample 2, identical to that of counter-example 1, is shown in FIG. 3A. The parameters of the filter 1' of the counter-example 2 were obtained at the end of a series of simulations of a model of that filter 1' aimed at shaping its transfer function to a predetermined template G, shown in FIG. 4A.

The period p of the input and output electro-acoustic transducers has been chosen to be 1.029 microns. The metallization width of the electrodes is chosen so that the a/p ratio is set to 0.54. The number of pairs of metal fingers of each transducer is set to 16.

The period of each external mirror is set at 1.060 microns. Each external mirror has 25 fingers and an a/p ratio of 0.5. The distance separating, respectively, the external mirrors of the input electroacoustic transducer and the output electroacoustic transducer is set at 0.301 micron.

The four reflection gratings R each have 10 metal fingers. The internal reflection gratings are separated by a distance Dg of 0.535 microns, corresponding to about a Bragg distance of a quarter-wavelength. The first and the last of these reflection gratings are spaced apart, respectively, from the input electroacoustic transducer and from the output electroacoustic transducer by a distance Srg, Slg of 0.594 microns.

The periods of these inner and outer reflection gratings 4 are all identical and equal to 1.060 microns.

Figure 4A:
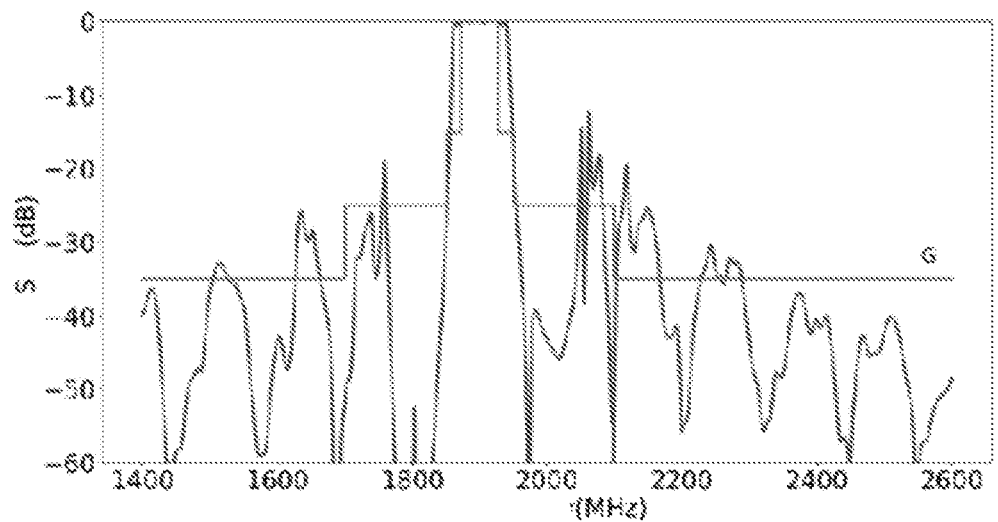
FIG. 4A shows the module of the transfer function of a filter according to a second counter-example.

FIG. 4A shows the module of the transfer function of this filter, as was obtained by simulation. It is observed that it conforms to the predetermined template in the passband, but, as in counter-example 1, the presence of a plurality of lobes, of particularly high amplitudes in the rejection band is observed.

Figure 4B:
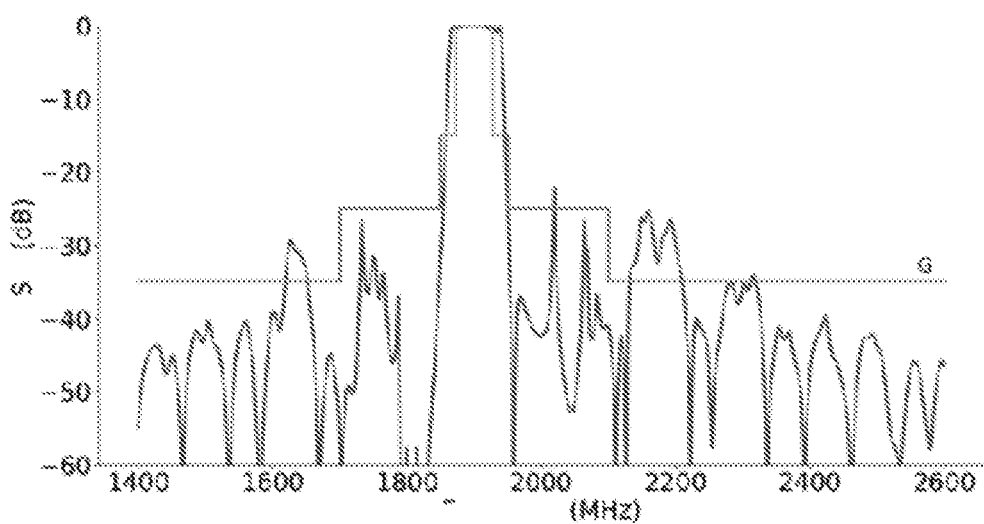
FIG. 4B shows the module of the transfer function of a filter of a second example embodiment of the present disclosure.

Example 2: A Filter Having a Center Frequency of 1900 MHz and 3.5% Relative Passband FIG. 4B shows the module of the transfer function of a filter synthesized by simulation from a filter structure shown in FIG. 3C and in accordance with the structure of a filter of the present disclosure.

The four reflection gratings R1, R2 each have 11 metal fingers. The other parameters also obtained by simulation of this filter are as follows:
First Structure Pright:
Srg: 0.496 microns
Rg: 0.290 microns, which is much lower than the Bragg distance Dg of 0.593 microns
Period of the reflection gratings R1 (the first period): 1.100 microns
Second Structure Pleft:
Slg: 0.767 microns
Lg: 0.827 microns, which is much higher than the Bragg distance Dg of 0.593 microns.
Period of the reflection gratings R2 (the second period): 1.009 microns It can be seen that the first period of the reflection grating R1 of the first structure Pright is much greater than the second period of the reflection grating of the second structure Pleft.

The distance Pcg separating the first structure Pright from the second structure Pleft is 0.56 microns, substantially equal to the arithmetic mean of the first distance Rg and the second distance Lg (0.558 microns).

The period p of the input and output electro-acoustic transducers has been chosen to be 1.0214 microns. The metallization width of the electrodes is chosen so that the a/p ratio is fixed at 0.545. The input transducer has 16 pairs of fingers and the output transducer has 16 pairs of fingers.

The period of each external mirror is fixed at 1.06 microns. Each external mirror has 30 fingers and a ratio a/p of 0.5. The distance separating, respectively, the external mirrors of the input electroacoustic transducer and the output electroacoustic transducer is set at microns.

FIG. 4B shows the module of the transfer function of this filter, as was obtained by simulation. It is clearly observed that it conforms to the template in the passband. In addition, and although lobes are still present in the rejection band, these are of much lower amplitudes, which are rejected at frequencies farther from the passband.

The performance of this filter is therefore much higher than the performance of the filter of counter-example 2, the structure of which conforms to a filter structure of the prior art.

The synthesis of a filter according to the present disclosure can be simplified by breaking it down into several steps.

During a first step, a first incomplete filter is synthesized comprising the input electroacoustic transducer 2a and the output electroacoustic transducer 2b, and only one of the first structure Pright and the second structure Pleft. It is naturally possible to integrate the external mirrors in the simulations if such mirrors are provided in the complete filter 1. The simulations carried out during this first step make it possible to establish the parameters of the chosen structure, that is to say at least the distance separating the reflection gratings R1, R2 included in this structure, and the number and configuration of these gratings.

During a second step, a second incomplete filter is synthesized, this time incorporating only one, either the first or the second structure Pright, Pleft, whichever was not selected during the first step. This second step makes it possible to establish the parameters of this filter structure, by simulations, as was done during the first step.

In a last step, the complete synthesis of the filter is carried out, by integrating the parameters determined at the first and second steps in the complete structure of the filter. As already mentioned above, it is possible to choose the distance Pcg separating the first structure Pright and the second structure Pleft to be the arithmetic mean of the first distance Rg and the second distance Lg. During this last synthesis step, a new simulation cycle can be carried out in order to verify that the filter's response fits the template and optionally to finely adjust certain parameters.

Of course, the present disclosure is not limited to the embodiment described and variant embodiments can be added thereto without departing from the scope of the present disclosure as defined by the claims. Although it was provided here to form the reflection gratings R1, R2 and the external mirrors 3a, 3b using arrays of metal fingers, they may alternatively be constructed by arrays of grooves etched into the composite substrate. These grooves can be etched in the piezoelectric upper layer of the composite substrate and reach the base substrate. The reflection gratings R1, R2 may also consist of dielectric obstacles having a shape identical to the metal fingers considered up to this point and deposited during a specific production phase of the filter. The materials of interest to produce these mirrors are silicon dioxide ($SiO_2$), silicon nitride ($Si_3N_4$), the combinations of these two materials making it possible to produce so-called oxynitrides of specific stoichiometry (of general form $SiO_XN_Y$), aluminum oxide ($Al_2O_3$), aluminum nitride (AlN), zirconium oxide ($ZrO_2$), hafnium oxide ($HfO_2$), tantalum pentoxide ($Ta_2O_5$), and, generally, the oxides may be deposited in the form of a surface layer of the substrates of interest according to the microelectronics methods.

The invention claimed is:

1. A surface elastic wave filter with resonant cavities, comprising:
    a composite substrate formed of a base substrate and a piezoelectric upper layer;
    at least one input electroacoustic transducer and at least one output electroacoustic transducer, disposed on the piezoelectric upper layer;
    at least one internal reflective structure, arranged between the at least one input electroacoustic transducer and the at least one output electroacoustic transducer, the at least one internal reflective structure comprising:
        a first structure comprising at least one reflection grating having a first period;
        a second structure comprising at least one reflection grating having a second period, the first period being greater than the second period;
    wherein:
        the at least one reflection grating of the first structure comprises a first plurality of reflection gratings separated from each other by a first distance; and
        the at least one reflection grating of the second structure comprises a second plurality of reflection gratings separated from each other by a second distance; wherein the first distance is less than the second distance.

2. The surface elastic wave filter of claim 1, wherein the first structure is distant from the at least one input electroacoustic transducer by a first separation distance, the second structure is distant from the at least one output electroacoustic transducer by a second separation distance, the first separation distance being less than the second separation distance.

3. The surface elastic wave filter of claim 2, further comprising two external mirrors arranged on either side of the at least one input electroacoustic transducer and at least one output electroacoustic transducer.

4. The surface elastic wave filter of claim 3, wherein the two external mirrors are made by arrays of metal fingers arranged on/in the piezoelectric upper layer of the composite substrate.

5. The surface elastic wave filter of claim 3, wherein the two external mirrors are made by arrays of grooves etched into the composite substrate.

6. The surface elastic wave filter of claim 3, wherein the two external mirrors are made by arrays of dielectric fingers arranged on the surface of the composite substrate.

7. The surface elastic wave filter of claim 1, wherein the first and second structure reflection gratings are made by arrays of metal fingers arranged on/in the piezoelectric upper layer of the composite substrate.

8. The surface elastic wave filter of claim 1, wherein the first and second structure reflection gratings are made by arrays of grooves etched into the composite substrate.

9. The surface elastic wave filter of claim 1, wherein the first and second structure reflection gratings are made by arrays of dielectric fingers arranged on the surface of the composite substrate.

10. The surface elastic wave filter of claim 1, wherein the composite substrate comprises at least one layer arranged between the base substrate and the piezoelectric upper layer.

11. The surface elastic wave filter of claim 1, wherein the base substrate has an electrical resistivity greater than 1000 ohm_cm.

12. The surface elastic wave filter of claim 1, wherein a thickness of the piezoelectric upper layer is less than 20 microns.

13. The surface elastic wave filter of claim 1, wherein the at least one input electroacoustic transducer and the at least one output electroacoustic transducer are respectively composed of two interdigitated comb electrodes.

14. The surface elastic wave filter of claim 1, wherein a distance separating the first structure and the second structure is equal to an arithmetic mean, to within 10%, of the first distance and the second distance.

* * * * *